(12) United States Patent
Mayor et al.

(10) Patent No.: US 7,706,172 B2
(45) Date of Patent: Apr. 27, 2010

(54) LAYOUT OF A SRAM MEMORY CELL

(75) Inventors: Cedric Mayor, Grenoble (FR); Denis Dufourt, Meylan (FR)

(73) Assignee: Arm Limited, Cambridge (GB)

( * ) Notice: Subject to any disclaimer, the term of this patent is extended or adjusted under 35 U.S.C. 154(b) by 420 days.

(21) Appl. No.: 11/547,549

(22) PCT Filed: Mar. 25, 2005

(86) PCT No.: PCT/IB2005/001015

§ 371 (c)(1),
(2), (4) Date: Aug. 27, 2007

(87) PCT Pub. No.: WO2005/096381

PCT Pub. Date: Oct. 13, 2005

(65) Prior Publication Data
US 2008/0062756 A1 Mar. 13, 2008

Related U.S. Application Data

(60) Provisional application No. 60/559,167, filed on Apr. 1, 2004.

(51) Int. Cl.
*G11C 11/00* (2006.01)
(52) U.S. Cl. .................. 365/154; 365/155; 365/156
(58) Field of Classification Search .................. 365/154, 365/155, 156, 181
See application file for complete search history.

(56) References Cited

U.S. PATENT DOCUMENTS

| 6,026,012 | A  | * | 2/2000 | Hsue ........................... 365/154 |
| 6,778,462 | B1 | * | 8/2004 | Castagnetti et al. ..... 365/230.05 |
| 6,858,949 | B2 | * | 2/2005 | Kasuga ....................... 257/141 |
| 7,023,056 | B2 | * | 4/2006 | Liaw ........................... 257/369 |
| 7,233,032 | B2 | * | 6/2007 | Liaw ........................... 257/202 |
| 7,345,909 | B2 | * | 3/2008 | Chang et al. ................. 365/154 |

* cited by examiner

*Primary Examiner*—Pho M. Luu
(74) *Attorney, Agent, or Firm*—Blakely, Sokoloff, Taylor & Zafman

(57) ABSTRACT

A SRAM memory cell including two inverters and a plurality of switches is provided. The SRAM cell is manufactured in a technology offering N/P shunt capabilities and the inputs of the inverters are connected to at least one pair of bit lines (BLa, BLa/; BLb, BLb/) via two of the switches. The switches are controlled by a signal word line (WLa, WLb). Each inverter includes a first transistor (MN0, MN1) of a first conductivity type and a second transistor (MP0, MP1) of a second conductivity type. Each switch includes at least a third transistor (MN2, MN3) of the first conductivity type, characterized in that the two transistors (MP0, MP1) of the second conductivity type in the inverters are arranged in two opposite end regions of the memory cell, respectively.

12 Claims, 11 Drawing Sheets

Figure 3:
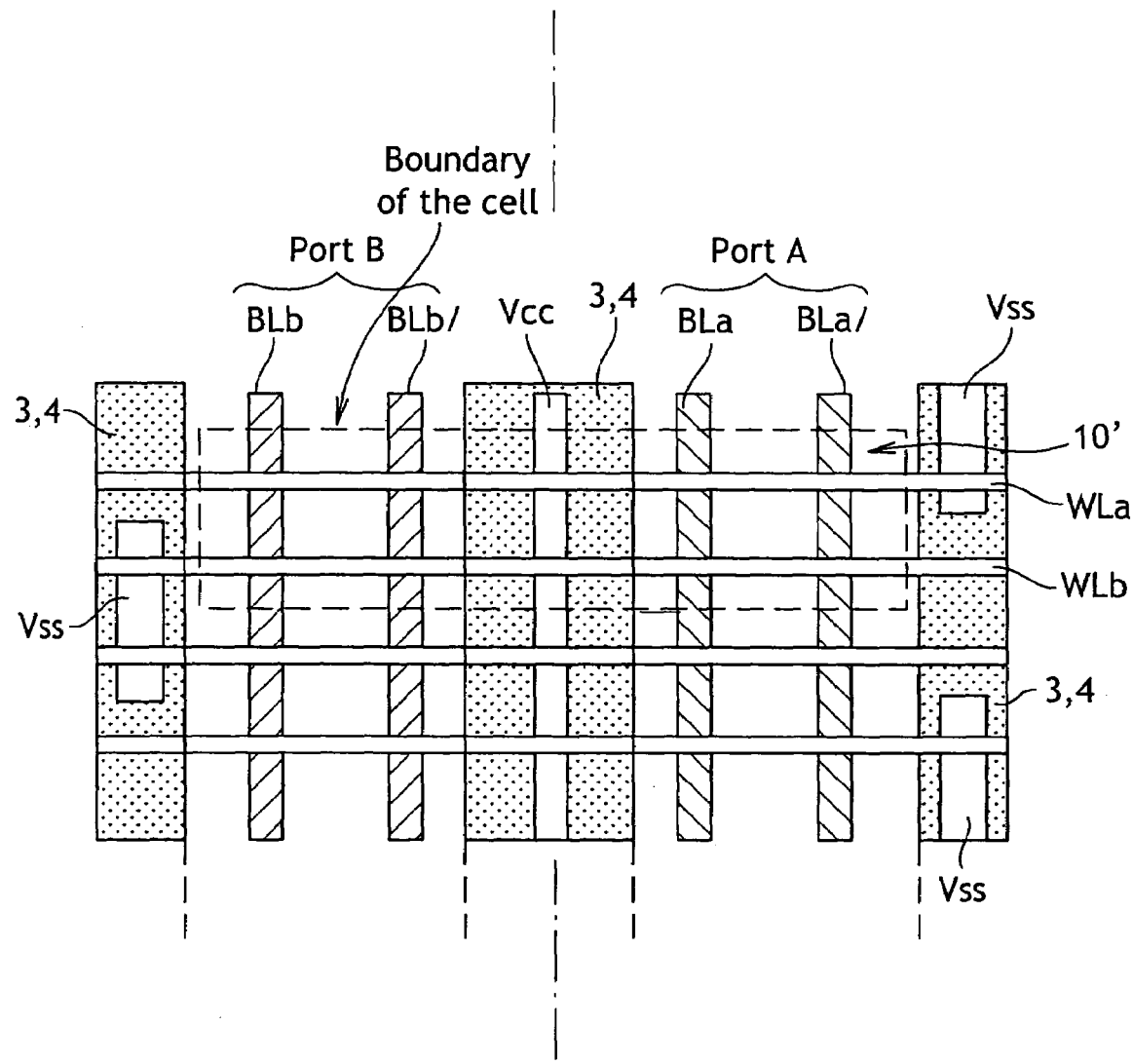

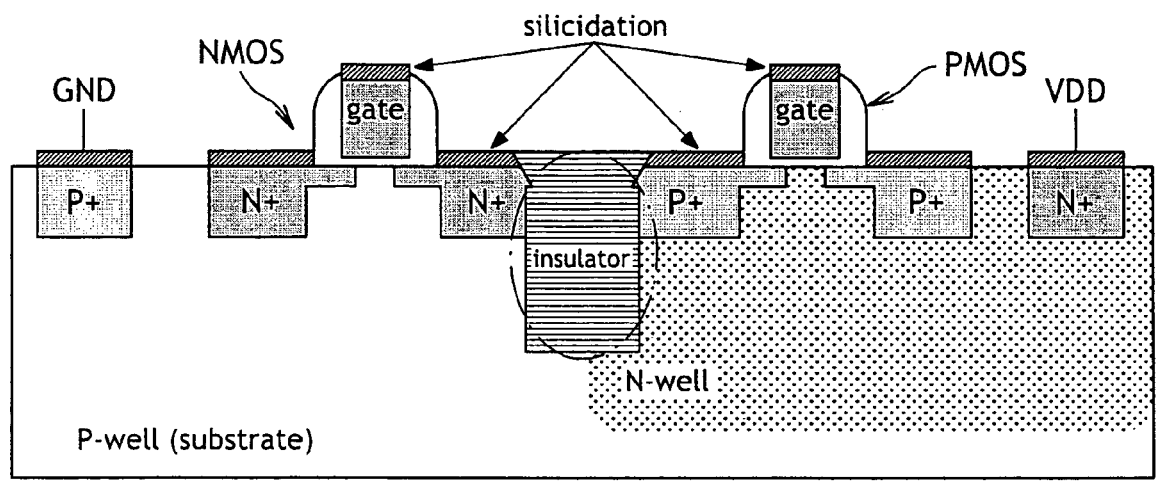
FIG.3'a
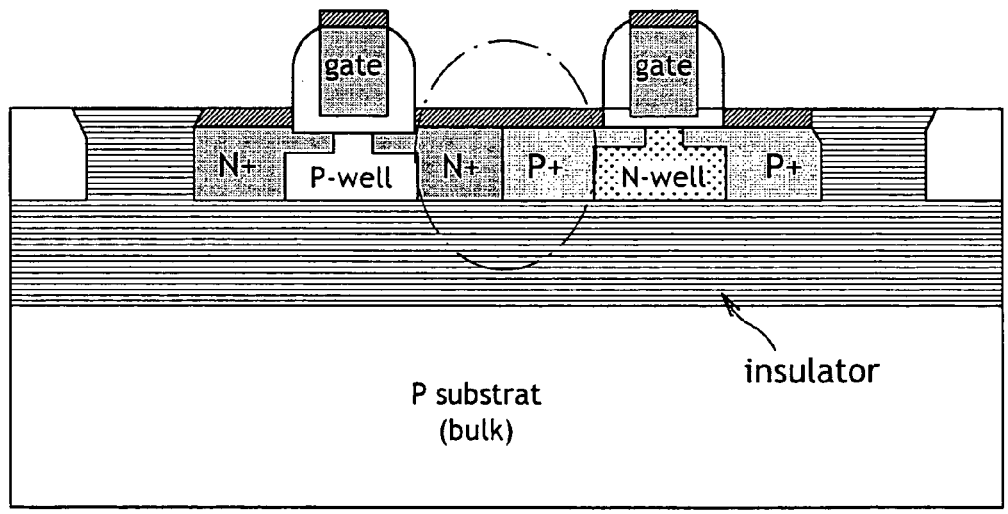
FIG.3'b

LAYOUT OF A SRAM MEMORY CELL

The present patent application is a non-provisional application claiming the benefit of International Application No. PCT/IB2005/001015, filed Mar. 25, 2005, which claims priority of U.S. Provisional Application No. 60/559,167, filed Apr. 1, 2004.

The present invention relates to memories comprising an array of memory cell rows and columns.

More particularly, the invention relates to a SRAM (Static Random Access Memory) memory cell comprising two inverters and a plurality of switches, the SRAM cell being manufactured in a technology offering a possible use of N/P shunts, the inputs of the inverters being connected to at least a pair of bit lines (BL, BL/) via two of said switches which are controlled by a signal word line (WL), each inverter comprising a first transistor of a first conductivity type and a second transistor of a second conductivity type, each switch comprising at least a third transistor of the first conductivity type.

There are many kinds of such SRAM memory cells.

As a non limitative example, single-port or double-port SRAM memory cells of that type are frequently used in electronic circuitry.

It is remarkable to note that most of the proposed layouts of such SRAM memory cells are based upon very common guidelines of design.

In order to illustrate this assertion, an example is described hereafter.

Figure 1:
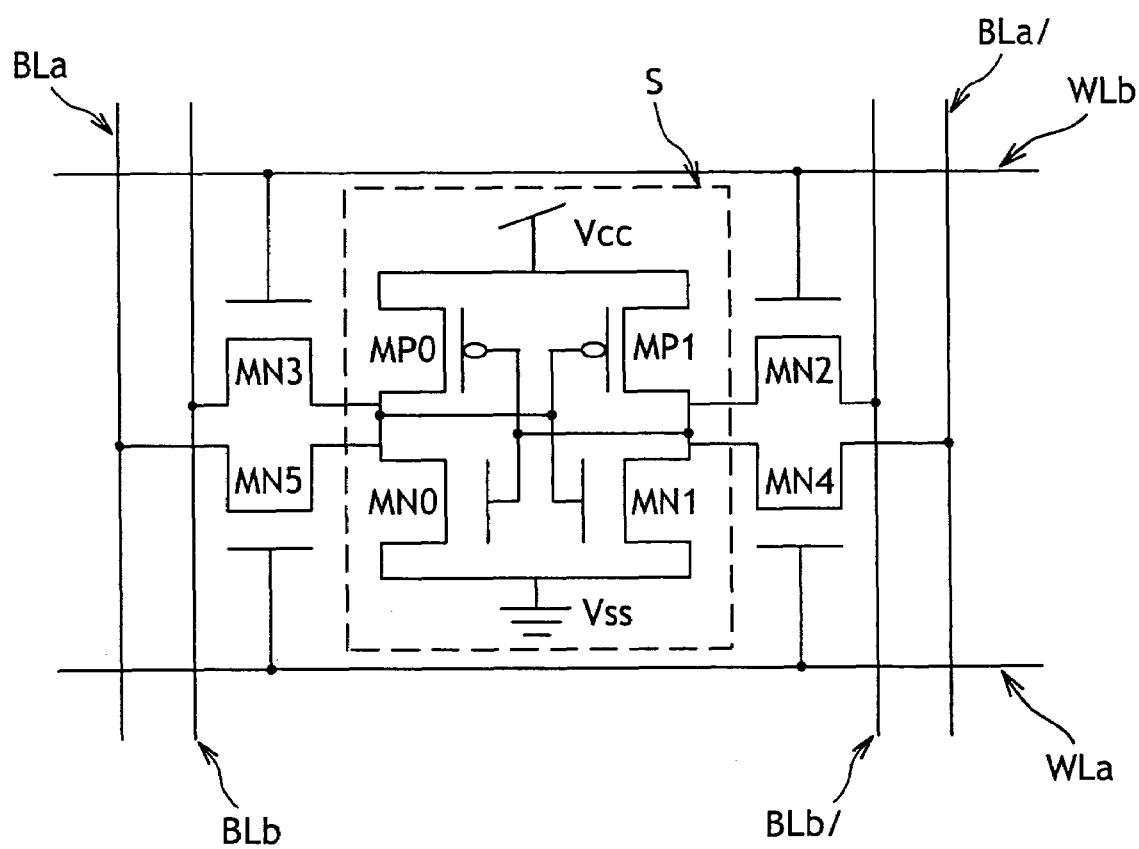

FIG. 1 shows a schematic of a double-port SRAM memory cell as proposed in U.S. Pat. No. 6,606,276.

This SRAM memory cell is manufactured in bulk silicon technology, and comprises eight transistors.

A complementary data storage device S is constructed by cross-coupling two CMOS inverters composed respectively of a PMOS transistor MP0, MP1 and a NMOS transistor MN0, MN1.

A pair of access transistors MN2 and MN3 provides connections between the data storage device S and both a first pair of bit lines BLa and BLa/ and a first word line WLa.

These bit lines and this word line correspond to a first access port A.

Another pair of access transistors MN4 and MN5 provides connections between the data storage device S and both a second pair of bit lines BLb, BLb/ and a second word line WLb, forming a second access port B.

Figure 2:
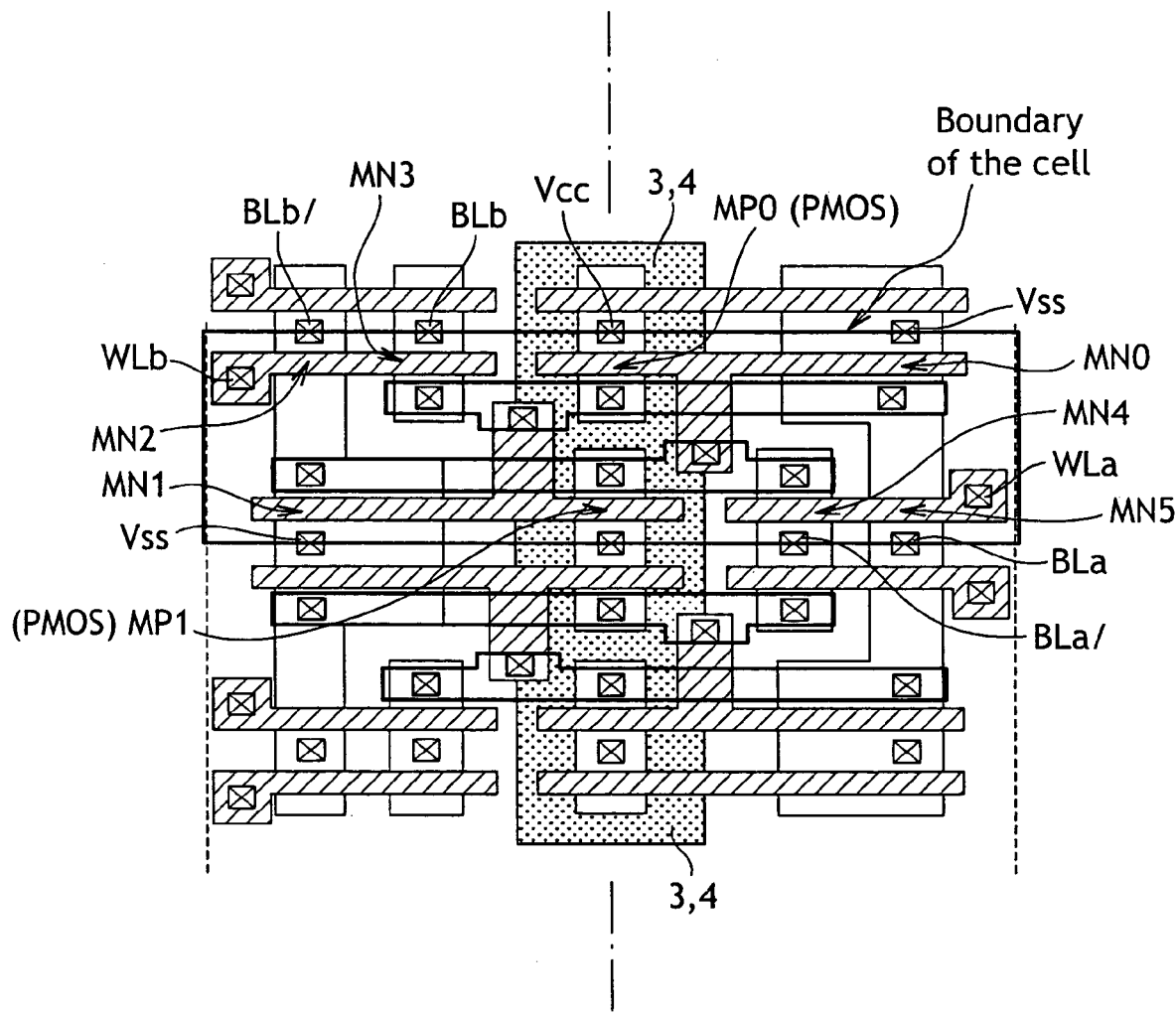

FIG. 2 shows schematically the layout which has been proposed in U.S. Pat. No. 6,606,276.

As can been seen, the design of the cell relies in particular on the following guidelines.

A first design guideline resides in the fact that the PMOS transistors of the two inverters must be placed at the center of the cell.

More particularly, the Nwell implants 3 of these transistors together with the associated regions of voltage threshold adjustment implant 4 must be merged and aligned with a direction parallel to the height of the cell.

Such an arrangement gives many advantages, in particular in terms of density area.

Indeed, well-known layout design rules require that two distinct Nwell implants must be separated with a minimum distance which may be important, in particular in comparison with other minimum distances dictated by other design rules.

Therefore, merging both regions 3, 4 of each PMOS transistor releases the designer from said distance constraint.

A second guideline resides in the fact that ports A and B must be arranged separately in the layout of the memory cell.

Preferably, these ports may be disposed on opposite sides of the PMOS transistors of the inverters.

Then, conductive tracks for memory cell power-supply may be inserted between these ports.

For example, said conductive tracks can be arranged as illustrated in FIG. 3.

In this figure, the bit line pairs BLa, BLa/ and BLb, BLb/ are disposed at the left-hand side and the right-hand side of the cell, respectively, and are separated with a conductive track VCC extending above the PMOS transistors of the inverters.

Such a guideline is known to advantageously provide a shield to a wire-to-wire coupling effect.

In this case the VCC conductive track reduces the coupling effect between ports A and B.

A third guideline consists in arranging the remaining transistors of the cell so as to limit the width and surface area of the memory cell, in particular by an ingenious design of contacts between transistors.

In the example of FIG. 2, using eight contacts made it possible to obtain a compact memory cell.

Naturally, the design of a SRAM memory cell of this type may be based on other well-known guidelines such as, for example, orienting the channel regions of the transistors in the same direction and generally symmetrically.

Such a guideline enables to implement a robust layout, namely a layout less sensitive to manufacturing variations such as lithographic misalignment.

In other words, this guideline improves the yield of memory arrays based on this cell.

It is also known that, in order to further improve its compactness, such a SRAM memory cell can be manufactured in a SOI substrate (Silicon On Insulator).

In this regard, an interesting feature of the SOI technology resides in the fact that the drain or the source electrode of a NMOS transistor which must be connected to the source or the drain of a PMOS transistor, respectively, can be abutted directly using a common active diffused area.

This feature which is not available in a bulk technology can be achieved without taking any risk of short-circuits between VCC and VSS, for instance.

Moreover, due to design rules again, a NMOS and a PMOS transistor must be separated with a minimum distance.

This is illustrated in FIG. 3'$a$ where the space between these two transistors is filled, as usually, with an insulator in order to create an isolation and more particularly to avoid short circuit between VCC and the ground VSS, for example via the N-well region of the PMOS transistor.

To the contrary, FIG. 3'$b$ illustrates that in a SOI technology, the drain of the NMOS transistor and the source of the PMOS transistor are abutted in order to achieve, in the meantime, the desired electrical connection and a gain in distance or surface area.

It is to be noted here that this feature is made possible due to the buried oxide insulator which is specific of a SOI technology, and which avoids said possible short circuit between VCC and VSS.

FIG. 3'$b$ also shows that a silicide layer (for example $CoSi_2$, $NiSi$, $TiSi_2$) may be formed on top of the diffused source and drain regions.

This material directly acts as an electrical shunt between the source and the drain, thus reducing the resistance of this connection.

It will be noted that such a structure comprising the abutment and the silicide layer will be referred in the following text as a N/P shunt.

An example of a SOI type SRAM memory cell has been proposed in document FR 2 843 481.

Compared to the memory cell as described above, this memory cell only comprises a single port A.

Therefore the only difference between this memory cell and the circuit shown in FIG. 1 resides in the fact there are two switch transistors instead of four.

Figure 4:
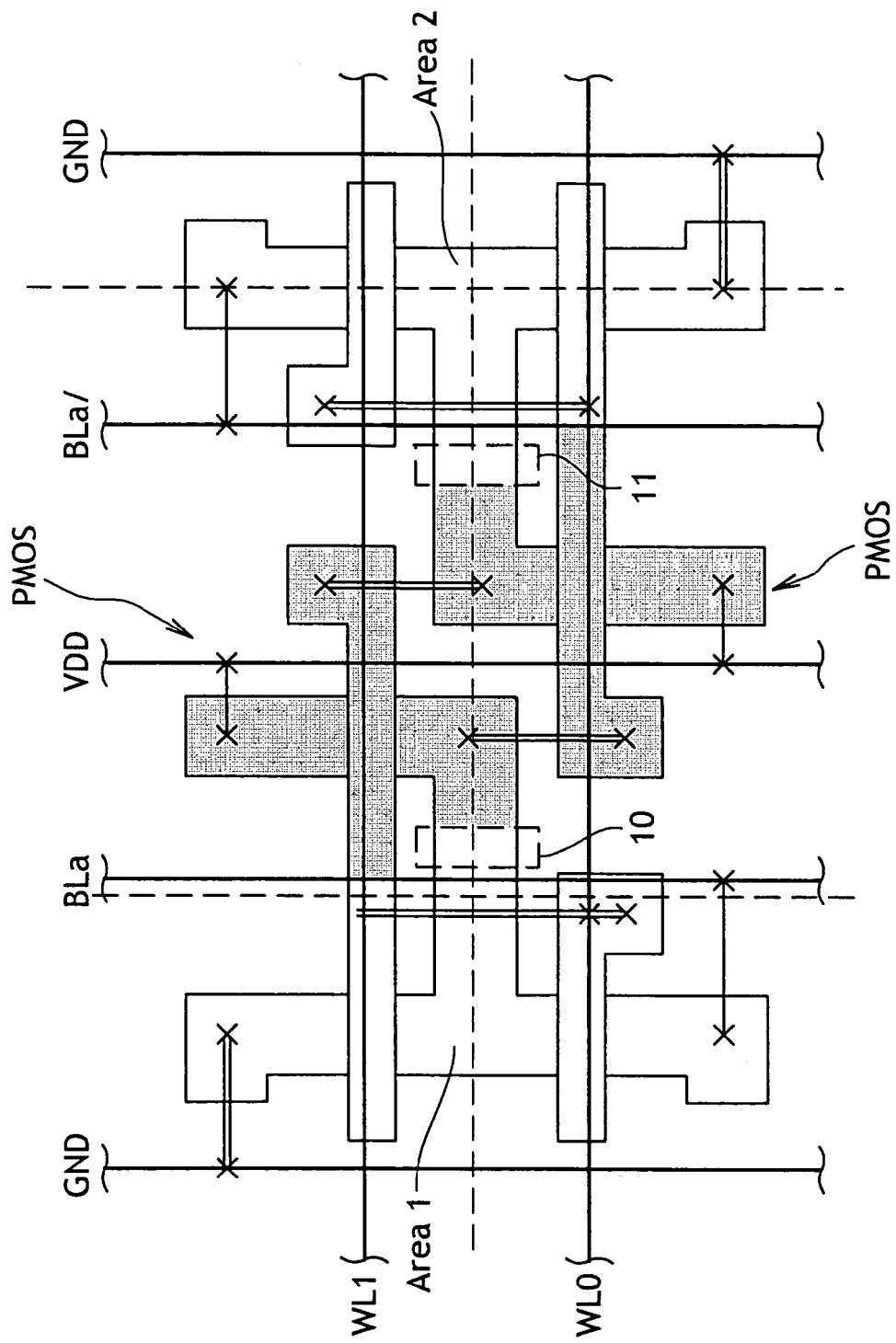

FIG. 4 shows the proposed implementation of such a single-port SRAM memory cell.

It can be observed that, as expected, the guidelines recited previously have been taken into account.

In particular, the SOI-type PMOS transistors of the two inverters (identified schematically in grey) are placed together at the center of the cell, their Nwell region and voltage threshold adjustment implant being merged.

Further, the ports are disposed separately in the memory cell layout.

More precisely, the design takes into account that the cell here comprises only a single port and thus separates the two bit lines BLa and BLa/ constituting said port A.

More particularly, BLa and BLa/ are disposed on both sides of the PMOS transistors of the inverters and a conductive track power supply VDD is inserted between them.

Finally, the remaining transistors are disposed in the cell so as to minimize the density area of the cell.

In particular, this arrangement is done so that only two active areas are needed to realize all the transistors of the cell.

Now, as represented with dotted rectangles, the memory cell takes advantage of using two N/P shunts 10 and 11 between the drain of the PMOS and NMOS transistors of each inverter or, similarly, the drain of said PMOS transistors and the drain of the NMOS transistors constituting the switches.

In such a manner, a gain in terms of surface area is achieved thanks in particular to a reduction of the width of the cell.

However, although this design has been very successful, there is a further need improving this kind of SRAM memory cell circuit.

The present invention aims at further improving the compactness of such a cell.

To achieve this object the invention proposes a SRAM memory cell comprising two inverters and a plurality of switches, the SRAM cell being manufactured in a technology offering N/P shunt capabilities, the inputs of the inverters being connected to at least one pair of bit lines via two of said switches, said switches being controlled by a signal word line, each inverter comprising a first transistor of a first conductivity type and a second transistor of a second conductivity type, and each switch comprising at least a third transistor of the first conductivity type, characterized in that the two transistors of the second conductivity type in the inverters are arranged in two opposite end regions of the memory cell, respectively.

Preferred aspects such a SRAM memory cell are the following:

- a conductivity type is set with a voltage threshold adjustment implant and wherein the implants of the two transistors of the second conductivity type in the inverter are spatially separated;
- the general shape of the cell comprises corners, and in that the two transistors of the second conductivity type of the inverter are arranged in two opposite corners;
- the cell shape is generally rectangular and two transistors of the second conductivity type of the inverter are arranged diagonally;
- the transistors of each inverter and the switch transistor(s) connected to the input of said each inverter in question are built with a unique active area;
- the gates of all the transistors in the cell are aligned along a given direction;
- each second transistor of the second conductivity type of the inverters is arranged so that, along said direction, they have in their vicinity only one adjacent transistor of the first conductivity type;
- said adjacent transistor of the first conductivity type constitutes the first transistor of one of the inverters;
- the cell comprises two pairs of contacts (35-36, 35'-36') arranged so that, in cooperation with two respective first levels of conductive tracks, the inputs of the inverters are respectively electrically connected to a port of the switch(es) which is(are) connected to said input in question;
- the cell is made in a SOI substrate;
- the inputs of the inverters are connected to a first pair of bit lines (BLa, BLa/) via a first pair of switches being controlled by a first word line (WLa), and to a second pair of bit lines (BLb, BLb/) via a second pair of switches being controlled by a second word line (WLb), each switch of said first pair of switches comprising said third transistor and each switch of said second pair of switches comprising a fourth transistor of the first conductivity type.

Further, the invention aims at providing a SRAM memory comprising a plurality of SRAM memory cells according to the invention.

Therefore, contrary to the usual practice, and more particularly to the first above-mentioned guidelines, the present invention surprisingly provides a very compact SRAM memory cell despite the fact that the PMOS transistors of the inverters are not merged together but separated from each other.

At the same time, the electrical performance of the memory cell according to the invention is very satisfactory, and possibly better than the one achieved in the prior art.

Further, it is to be noted that such improved cell is made possible due to said separation, but also due to the availability of N/P shunts.

This is the reason why, in order to get advantage from the present invention, it is preferable to manufacture a SRAM memory cell according to the invention in a technology offering N/P shunts capabilities such as a SOI technology.

Figure 5:
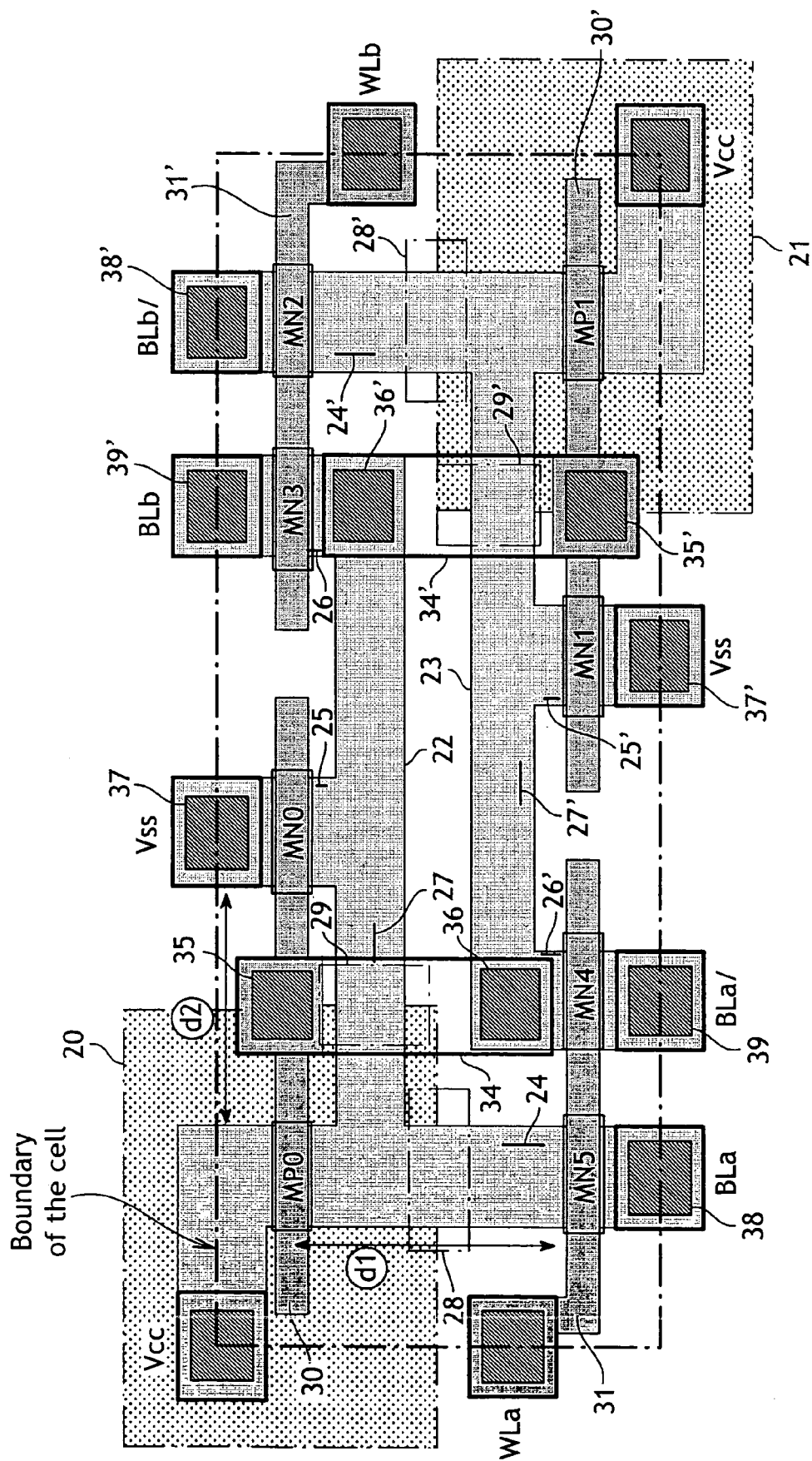
Figure 6:
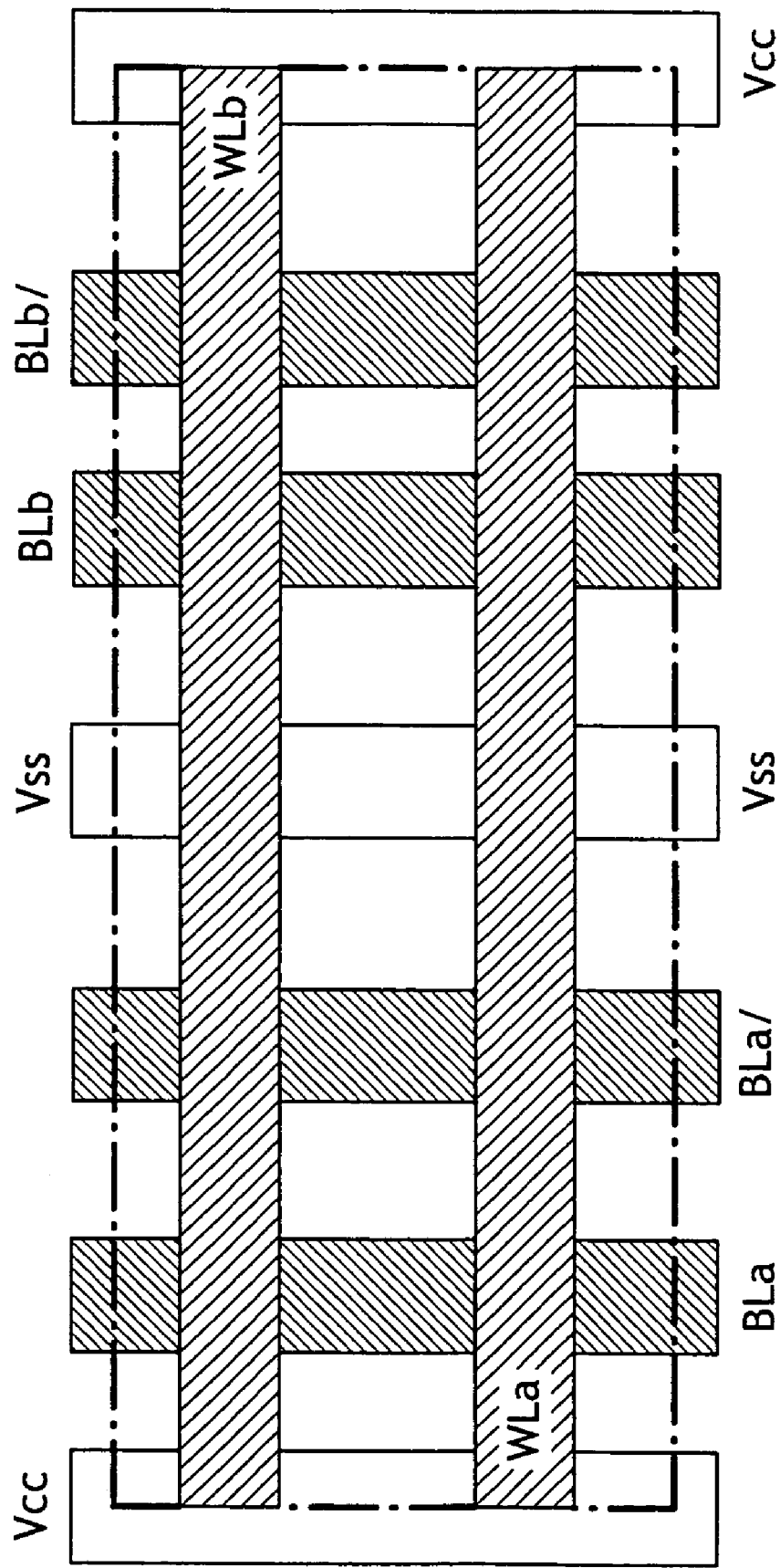
Figure 7:
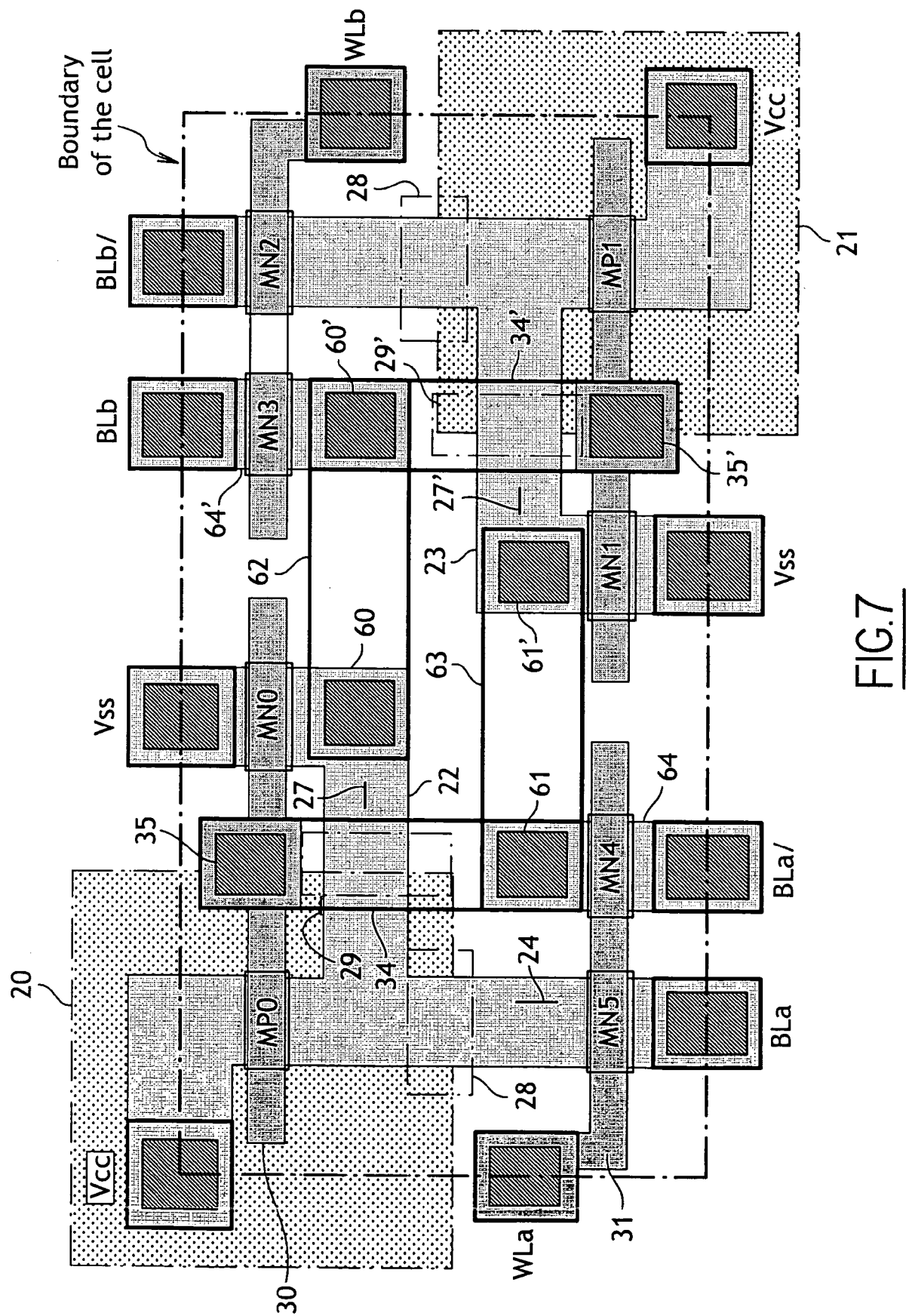
Figure 8:
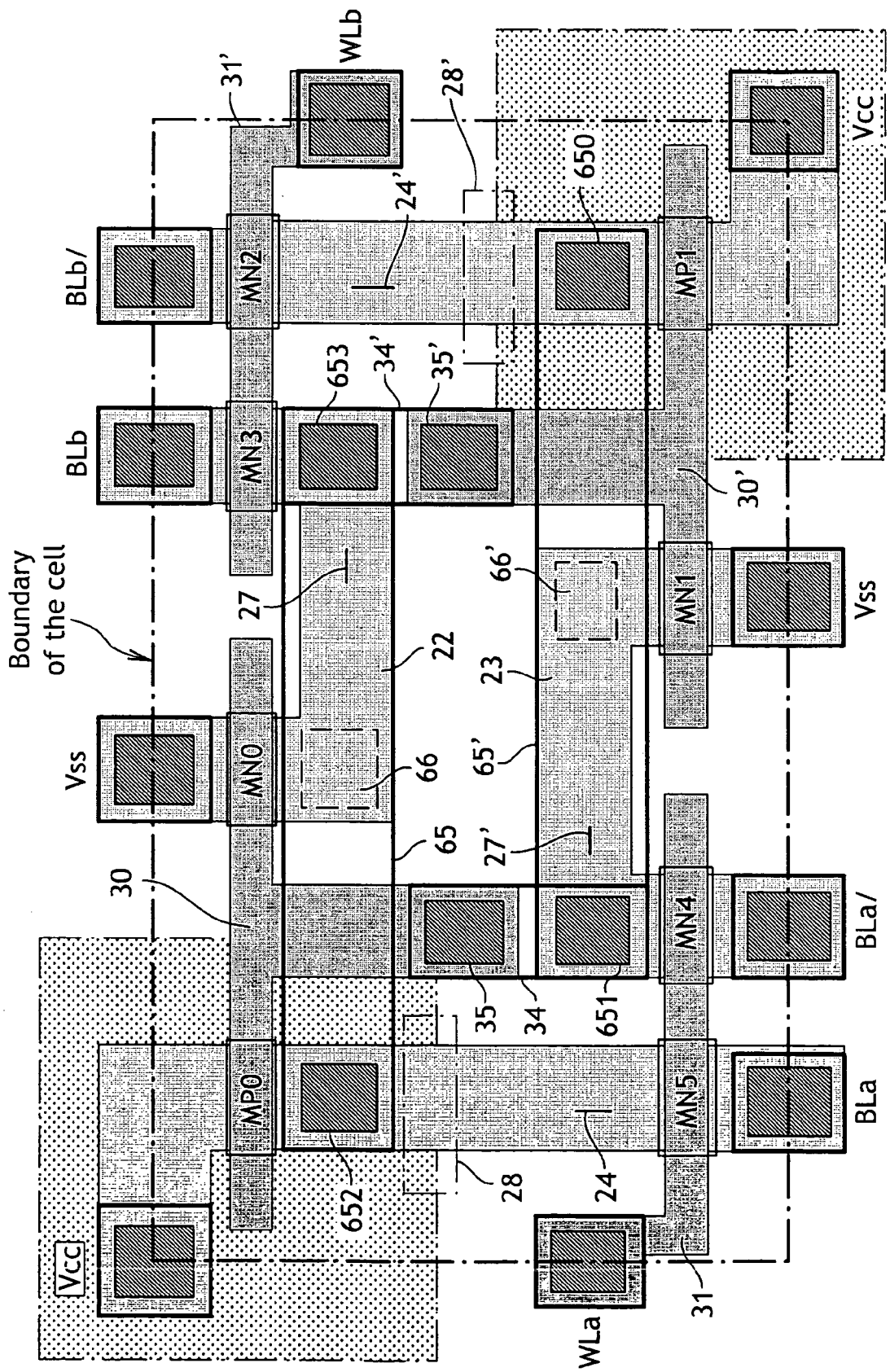
Figure 9:
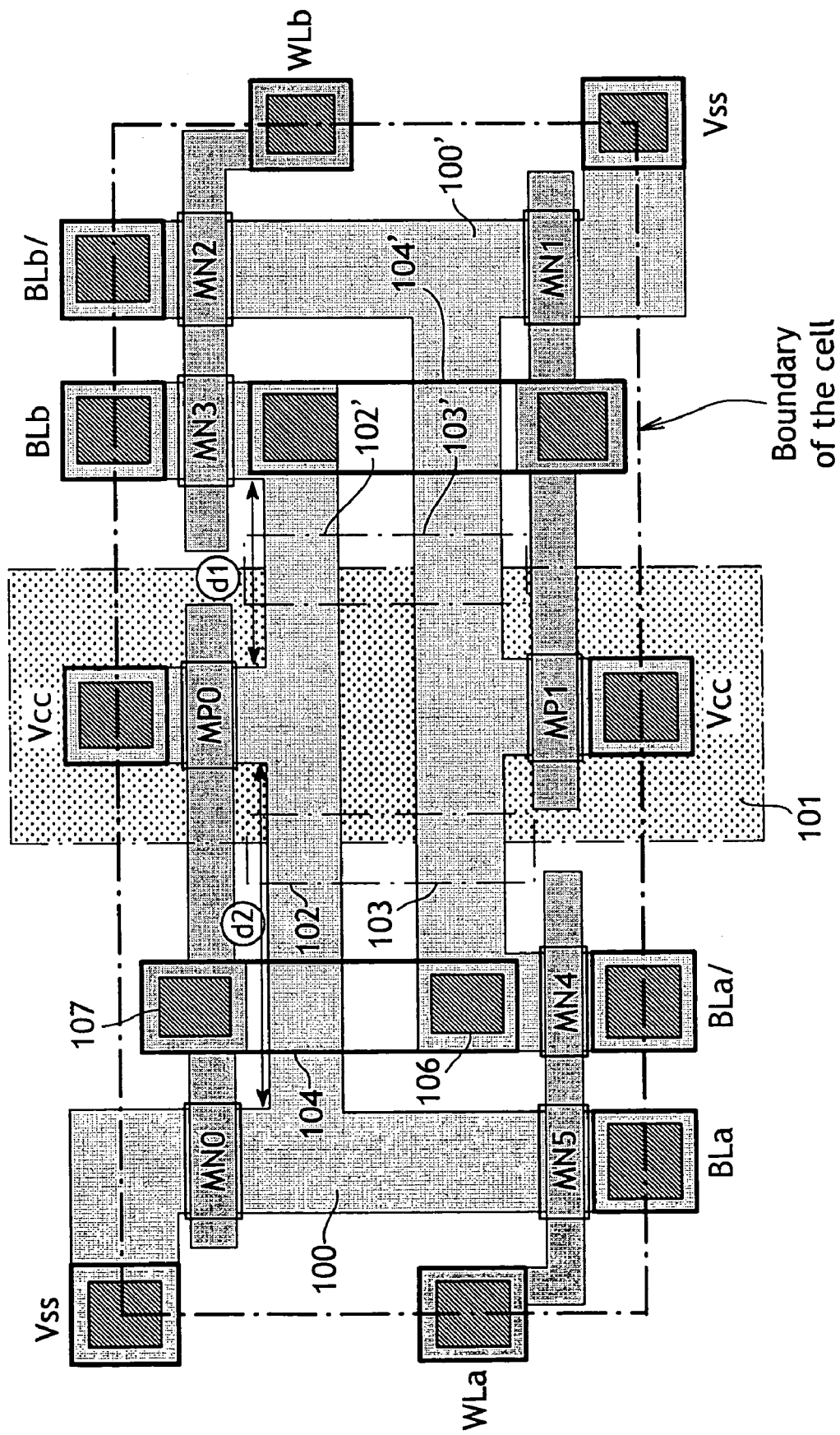
Figure 10:
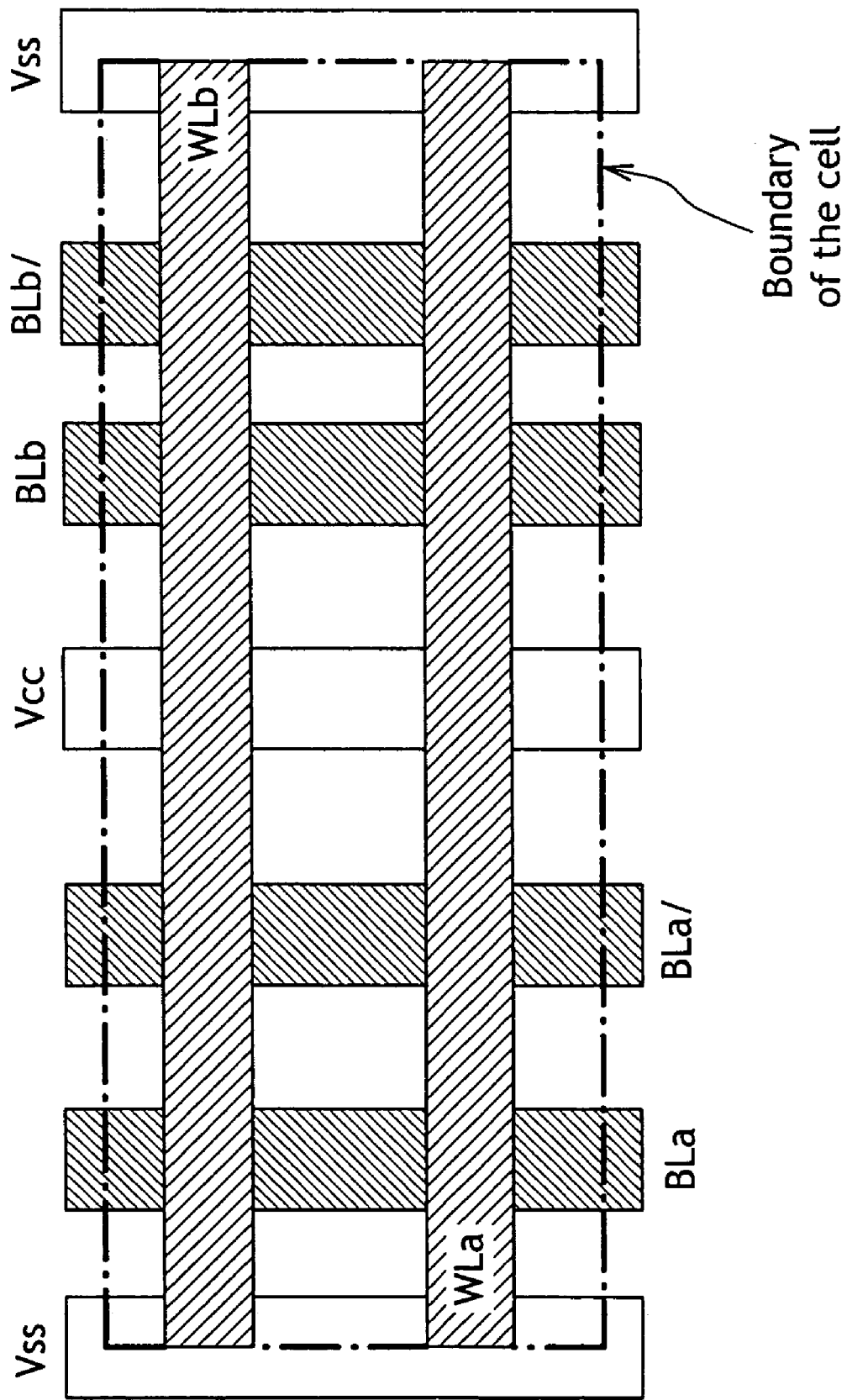

Further aspects, objects and advantages of the present invention will be more clearly apparent on reading the following detailed description of a preferred implementation of the invention, this being given by way of non limiting example and with reference to appended drawings in which:

FIG. 1 which has been commented above shows the schematic of a prior art double-port SRAM memory cell manufactured in a bulk technology, FIG. 2 which has been commented above shows a prior art layout implementation of the cell in FIG. 1, FIG. 3 which has been commented above shows the conductive track arrangement associated to the cell of in FIG. 2, FIG. 3' which has been commented above illustrates an advantageous feature in terms of compactness of a SOI technology (FIG. 3'*b*) compared to a bulk technology (FIG. 3'*a*), FIG. 4 which has been commented above shows a prior art layout implementation of a single-port SRAM memory cell manufactured in a SOI technology, FIG. 5 illustrates, for a double-port SRAM memory cell, an embodiment according to the invention, FIG. 6 illustrates a conductive track layout which may be associated with the embodiment of FIG. 5, FIG. 7 illustrates a first alternative of the embodiment illustrated in FIG. 5, FIG. 8 illustrates a second alternative of the embodiment illustrated in FIG. 5, FIG. 9 illustrates an alternative layout which is not beyond the scope of the invention and which could have been proposed instead of performing the method according to the invention, and FIG. 10 illustrates a conductive track layout which may be associated with cell layout of FIG. 9, Preliminarily, it should be noted that, as usual in the field of integrated circuit representation, the dimensions of the various layers, strips, tracks, etc. are not drawn to scale, either within the same drawing, or from one drawing to another, and this in order to improve the readability of said drawings.

Further, same reference numerals will designate as far as possible, in the different drawings, the same elements.

First of all, the present invention concerns a double-port SRAM memory cell, the circuit diagram of which has already been shown in FIG. 1.

Referring now to FIG. 5, a first exemplary layout of an embodiment of a SRAM cell according to the invention is illustrated.

This layout naturally comprises eight transistors identified by the same reference names as in FIG. 1 and which are formed on a substrate of the silicon on insulator (SOI) type.

According to the invention, the PMOS transistors of the inverters are arranged in two opposite end regions of the memory cell.

In particular, in this preferred example, the cell layout is arranged so that threshold voltage adjustment implants 20, 21 of these transistors are spatially separated.

As can be seen in FIG. 5, the shape of the cell is generally polygonal and hence comprises corners, and said two opposite regions preferably are two corners regions of the cell, most preferably diagonally opposed corner regions.

Among other advantages, this enables to obtain a cell having a center of symmetry.

However, it remains possible to dispose said PMOS transistors in two other opposite corners, e.g. in the left and right-hand sides upper part of the cell.

FIG. 5 further shows that the memory cell comprises two active areas 22, 23 which are substantially symmetrical with respect to said center of symmetry.

The active area 22 comprises a first vertical portion 24 corresponding to transistors MN5, MP0, and to the connection between these transistors.

The drains of MP0 and MN5 are abutted with a N/P shunt 28.

The active area 22 also comprises a second vertical portion 25, at the right-hand side and substantially at the height of the first vertical portion, corresponding to transistor MN0.

It further comprises a third vertical portion 26 corresponding to transistor MN3.

This vertical portion 26 is disposed at the right-hand side of, and substantially at the same height as, the second vertical portion 25.

The active area 22 further comprises a horizontal portion 27 connecting said vertical portions 24, 25, 26.

In this regard a N/P shunt 29 is arranged in this horizontal portion 27 to directly connect the drain of MN0 and MN3 to the drain of MP0.

Similarly, the active area 23 comprises:
a first vertical portion 24' corresponding to transistors MN2, MP1, and to the connection between these transistors; the drains of MP1 and MN2 are abutted with a N/P shunt 28',
a second vertical portion 25', at the left-hand side of, and substantially at the same height as, the first vertical portion 24', corresponding to transistor MN1,
a third vertical portion 26', at the left hand side of, and substantially at the same height as, the second vertical portion 25', corresponding to transistor MN4, and
a horizontal portion 27' connecting the said three vertical portions 24', 25', 26'.

Four portions of a horizontal silicon strip 30, 31, 30' and 31', preferably a polysilicon strip, form the gates of transistors MP0 and MN0, MN5 and MN4, MN1 and MP1, MN2 and MN3, respectively.

The drain of transistor MN4 is connected to the gate of the inverter constituted by MN0 and MP0, namely to the polysilicon strip 30, via a level-one vertical metal track 34.

It is understood that two contacts are needed to realize this connection.

Preferably, the first contact 35 is placed just above the polysilicon strip 30 and at the level of the drain of MN4, and the second contact 36 is placed just above the drain diffusion of MN4.

Such an arrangement enables having for the level-one vertical metal track 34 a straight shape.

Similarly, the drain of transistor MN3 is connected to the gate of the inverter constituted by MN1 and MP1, namely to the polysilicon strip 30', via another level-one vertical metal track 34'.

For the same reason than before, it is preferred that the first contact 35' is placed just above the polysilicon strip 30' and at the level of the drain of MN3, and the second contact 36' be placed just above the drain diffusion of MN3.

FIG. 6 shows the layout of the conductive tracks corresponding to the power supply VCC, VSS, the two pairs of bit lines BLa, BLa/ and BLb, BLb/, and the two word lines WLa, WLb.

A unique conductive track VSS extends vertically at the center of the cell, substantially above MN1 and MN0.

The connection between VSS and the source of these transistors is performed with a contact and at least one associated via (references 37 and 37').

Further, the conductive track corresponding to VSS is formed with a conductive material layer located at a level higher than or identical to the one including the bit lines for the ports A et B, as described hereafter.

Two conductive tracks corresponding to the bit lines BLa, BLa/ extend vertically at the left-hand side of VSS and two others conductive tracks corresponding to BLb, BLb/ are arranged symmetrically to BLa, BLa/ with respect to VSS, i.e. at the right-hand side of VSS.

Further, two contacts (references 38 and 39), optionally together with two associated vias, are placed above the sources of MN5 and MN4 and enable a connection with the conductive tracks BLa and BLa/, respectively.

Similarly, two contacts (references 38' and 39'), optionally together with two associated vias, are placed above the sources of MN2 and MN3 and enable a connection with the conductive tracks BLb/ and BLb, respectively.

The pairs of conductive tracks BLa, BLa/ and BLb, BLb/ are drawn with a conductive material layer located at a level higher than or identical to the level-one metal track.

Two conductive tracks corresponding to VCC extend vertically on both sides of the cell.

More particularly, half of their width extends vertically along the height and at the boundary of the cell and the other half extends along the height and at the boundary of an adjacent cell. Therefore these two conductive tracks are shared between the adjacent cells.

One of the conductive tracks corresponding to VCC is connected to the source of MP0 and the other one to the source of MP1.

For that purpose, a contact associated with at least one via is disposed above each of these sources.

Further, the power-supply conductive tracks VCC, VSS are drawn with a conductive material layer located at a level higher than or identical to the one including the bit lines for the ports A et B.

Finally, two conductive tracks corresponding to the word lines WLa and WLb extend horizontally above the cell and are generally symmetrical with respect to the symmetry center of the cell.

More precisely, the word lines WLa extend horizontally substantially at the level of transistor MN4 and the word lines WLb extend horizontally at the level of transistor MN2.

In such a manner, the gates of MN4, MN5 and MN2, MN3 can be easily connected to WLa and WLb, respectively, using two contacts and two associated vias.

The two conductive tracks corresponding to these word lines are drawn with at least one level-two metal track.

This first exemplary embodiment of the invention has the following non limitative advantages.

The replacement of contacts or vias by N/P shunts, makes it possible to substantially decrease the distance d2 between the channels of the transistors of the inverters (e.g. between MP0 and MN0), and the distance d1 between the channels of the PMOS of one of the inverters and of an associated switch transistor (e.g. between MP0 and MN5).

Further, the arrangement of the PMOS transistors of the inverters, in particular the arrangement of their respective voltage threshold adjustment implants, makes it possible to reduce the occurrence of the distance d2 along the width of the cell.

As a non limitative comparison, in a conventional design where the PMOS transistors of the inverters would be merged at the center of the cell, there are at least two distances d2: a first distance d2 between the PMOS transistors and their respective NMOS neighbors placed at their left-hand side, and a second distance d2 between said PMOS transistors and their respective NMOS neighbors placed at their right-hand side.

Therefore, the memory cell of the invention has a reduced surface area.

As a non limitative comparison, it has been easy to achieve a surface area of 4.5 $\mu m^2$ when implementing this memory cell in a 130 nm SOI technology (with no violation of design rules), while the memory cell in U.S. Pat. No. 6,606,276 which would have been implemented in said technology would have a surface area of at least 4.9 $\mu m^2$ (with violation of few design rules).

The one skilled in the art will also understand that, in order to obtain the compactness advantage of the invention, the adjacent cells must be arranged in such a manner that they share the same input and output ports.

In this regard the ports VCC, VSS, WLa, WLa/, BLa, BLa/, BLb, and BLb/ are all placed in the boundary region of the cell.

Other advantages exist compared to the prior art, and in particular to U.S. Pat. No. 6,606,276:

the wavering of the design rules and the lithographic manufacturing step are made easier in the layout thanks in particular to a minimal use of contacts (4 contacts are saved compared to the embodiment proposed in U.S. Pat. No. 6,606,276), the manufacturing yield is improved thanks to the central symmetry of the cell, to the memory cell dimension shrink and also to the reduction of the number of included contacts, the parasitic resistance of the internal data storage node (BL and BL/) is reduced thanks to the N/P shunts which replaces at least two contacts and a conductive track from said document U.S. Pat. No. 6,606,276, a better flexibility is offered regarding the choice of conductive material(s) forming:
the supply tracks VCC,
the ground tracks VSS,
the bit lines of port A,
the bit lines of port B, The N/P shunt provides a free vertical routing pitch direction for the level-one metal track and even further for higher levels.

In other words, the following relationship may be written:

$$i \geq 1; i \leq j \leq k; i+1 \leq k$$

where i, j, and k indicate the metal track level numbers available in the technology.

Manufacturing the power supply conductive tracks VCC and VSS and the bit lines with level-one metal tracks or even with tracks of higher level is made easier.

Further, the word line conductive tracks corresponding to WLa and WLb may be manufactured using a higher level of metal than those mentioned here above (vertical conductive tracks for Vcc, Vss, BLa, BLa/, BLb and BLb/).

Referring to FIG. 7, a first alternative of the embodiment of the invention will be described.

In this alternative embodiment, the drains of MN0 and MN3 are connected thanks to two contacts 60, 60' and a horizontal conductive track 62, preferably a level-one metal track.

Similarly, the drains of MN1 and MN4 are connected thanks to two other contacts 61, 61' and another horizontal conductive track 63, preferably a level-one metal track.

Therefore, in the horizontal direction, the active areas 22 and 23 do not extend any longer beyond the drain of MN0 and MN1, as the connection between these transistors and MN3, MN4 is performed via said two level-one metal tracks 62, 63, respectively.

The cell now comprises four distinct active areas 22, 23, 64, 64'; the two additional active areas 64 and 64' constitute the transistors MN4 and MN3, respectively.

Most of the advantages of the previously described embodiment are maintained except that the flexibility in selecting the conductive material layer is substantially reduced.

In particular the four N/P shunts are still used, which is advantageous, but the tracks of the $i^{th}$ conductive material layer must be drawn using at least the second conductive material layer (i>2) in order to prevent a cross connection between the bit lines conductive tracks and internal nodes of the cell.

It is to be further noted that in a SRAM memory cell having more than the two ports A and B, this kind of alternative may be interesting regarding parasitic resistance between the drains of MN0-MN3, and MN1-MN4.

As an example, the additional ports (for example port C), and thus the additional associated switch transistors, may be placed between MN0 and MN3 and between MN4 and MN5.

Therefore, the horizontal portions of active area 22, 23 may be larger than in the double-port embodiment, and hence the resistance between the transistors connected with this material layer may be higher than if some of these connections are replaced with the horizontal level-one metal tracks proposed in the two-port embodiment of the invention.

FIG. 8 shows a second alternative of the preferred embodiment of the invention, in which two horizontal conductive tracks 65, 65', preferably two level-one metal tracks, connect the drains of MN3, MP0 and MN4, MP1, respectively.

It is understood that four contacts 650, 651, 652, 653 are needed to perform these two connections.

In order to keep compactness as low as possible, these contacts may be placed as close as possible to the channel regions of these transistors.

The horizontal portions of active area 22, 23 which, in the first alternative, were connecting the drains of MP0 and MN0 and the drains of MP1 and MN1, now respectively connect the drains of MN3 and MN0 and the drains of MN1 and MN4.

Therefore, in this second alternative, only two N/P shunts are required to connect, as before, the drains of MP0 and MN5 and the drains of MP1 and MN2, respectively.

Such an arrangement may be efficient if the two vertical conductive tracks 34, 34' are shortened, otherwise cross connections shall occur with tracks 65, 65'.

In order to prevent these cross-connections, the two contacts 35, 35' are moved vertically closer to the transistors MN4, MN3, respectively.

As can be seen in FIG. 8, these contacts 35, 35' are placed substantially at mid-height of the cell and a portion of the two horizontal polysilicon strips constituting the input of the inverters is vertically stretched so as to reach said contacts 35, 35'. These stretched portions extend vertically between MN0, MP0 and MN1, MP1.

An alternative layout of this double-port memory cell will now be described with reference to FIGS. 9 and 10.

This alternative layout is derived from the teachings of document FR 2 843 481 which describes a SOI-type single-port SRAM memory cell, and enlightens some advantages of the SRAM memory cells provided by the invention.

It is to be noted that elements and features already described in FR 2 843 481 will not be described again.

As can be seen in FIG. 9, all the transistors are oriented in the same direction and placed symmetrically with respect to the center point of the memory cell.

Two active regions 100, 100' enable to form all these transistors.

The two PMOS transistors MP0, MP1 of the inverters are conventionally gathered in a unique region located at the center of the memory cell and surrounded by two NMOS regions at each side.

There is only one voltage threshold adjustment implant 101 dedicated to both MP0 and MP1.

Four N/P shunts 102, 102', 103, 103' connect respectively the drain of MP0 to the drain of MN0, the drain of MP0 to the drain of MN3, the drain of MP1 to the drain of MN4, and the drain of MN1 to the drain of MP1.

It is to be noted here that compared to a single-port SRAM memory cell, the additional port B is symmetrical to the port A with respect to the implant 101.

Further, all the switch transistors in this double-port SRAM memory cell are arranged so that for a given port, the two associated switch transistors lie side by side (this is the case for example for MN5 and MN4, respectively corresponding to the bit lines BLa, BLa/).

Therefore, compared to the memory cell of document FR 2 843 481, this layout is somewhat larger.

Two vertical conductive tracks 104, 104' respectively connect:
the drains of MP1 and MN1 with the gates of MN0 and MP0,
the drains of MP0 and MN0 with the gates of MN1 and MP1.

End regions of these two conductive tracks 104, 104' are respectively located above the drains of MN4 and MN3.

Two parallel word lines WLa and WLb, as illustrated in FIG. 10, are respectively connected to the pairs of access transistors MN4, MN5 and MN2, MN3.

These word lines are manufactured using a conductive track of level 2 at least.

Two pairs of parallel conductive tracks BLa, BLa/ and BLb, BLb/ of level higher than, or identical to 1 enable to make the desired connections between the switch transistors and their respective bit lines.

It is understood that contacts and vias are also provided for these connections.

Two power supply conductive tracks VCC and VSS are formed using a material layer at a level higher than, or identical to, the level of the bit lines for the ports A et B.

Finally, a unique conductive track corresponding to the power supply VSS is formed using a material layer at a level higher than, or identical to, the level of the bit lines for the ports A et B.

This layout of a double-port SRAM memory has increased advantages compared in particular to the cell according to U.S. Pat. No. 6,606,276.

First of all, it is more compact (although less compact than the embodiment of FIG. 5 and seq. of the present invention).

As a non limitative example, in a 130 nm SOI technology, the surface area of this alternative layout having two voltage threshold adjustment implants merged at the center of the cell is around 4.7 $\mu m^2$ (worst case; no violation of design rules) against 4.9 $\mu m^2$ (best case; violation of few design rules) for the cell corresponding to U.S. Pat. No. 6,606,276.

Further, as mentioned above, the N/P shunt provides an available vertical routing direction for the first conductive material layer and higher conductive material layers.

In other words the designer of such a cell has more flexibility regarding the choice of conductive material layers which constitutes in particular VCC, VSS and the bit lines of ports A.

Further, the manufacturing yield and the parasitic resistance of the internal data storage node S are substantially improved.

A comparison of FIGS. 5 and 9 in terms of cell compactness will now be given.

It is first reminded that d2 designates the distance between the channels of the transistors of the inverters (e.g. between MP0 and MN0 in FIG. 9), and that d1 designates the distance between the channels of the PMOS of one of the inverters and a switch transistor (e.g. between MP0 and MN3 in FIG. 9).

These distances are particularly discussed in this description because they are very important compared to any other distances based on the design rules and thus constitute a critical parameter for cell density.

As can be seen in FIG. 9, the width of the cell includes inter alia the sum of large elementary distances d1 and d2 (an elementary distance must be understood as a distance related to a design rule of the technology).

In FIG. 5, the cell according to the invention has a width which includes only one elementary distance d2.

Therefore this cell can be made narrower than the one proposed in FIG. 9.

Such an advantage is achieved thanks to the arrangement of the PMOS transistors of the inverters, in particular because their neighbors are either a switch transistor at a distance d2, either a PMOS transistor of an adjacent cell sharing the same voltage threshold adjustment implant.

On the contrary, in FIG. 9, the PMOS transistors of the inverter, being placed at the center of the cell, they are bound to have as neighbors NMOS transistors, which requires the presence of two large elementary distances d1 and d2, more precisely d1+d2.

Regarding the height of the cells, it is mainly determined by the number of contacts which are disposed inside them and which are aligned in the vertical direction.

As can be seen from FIGS. 5 and 9, this number is equal whatever the cell layout is (for example there are two contacts 35 and 36 in FIG. 5 and two contacts 106 and 107 in FIG. 9).

It is understood that many other alterations, modifications, and improvements of the invention are intended to be part of this disclosure, and are intended to be within the scope of the present invention.

In particular, the invention makes it possible to add in an easy manner a capacitor in the internal data storage node (BL and BL/ in general), for example a metal capacitor.

A further advantage of such a SRAM cell resides in the fact that the robustness regarding soft-errors is increased without increasing the surface area.

The invention easily provides such advantage because the use of the conductive level-one metal layer is very limited, giving thus lots of arrangement flexibility.

For example the capacitor may easily be made with metal layers of level superior or equal to two.

The invention may also be applied efficiently to single-port, triple-ports or more generally multiple ports SRAM memory cells.

Further, it is understood that the above description referring to SRAM memory cells having NMOS switch transistors (memory of type N) can be obviously adapted for SRAM memory cells having PMOS switch transistors (memory of type P).

As an indicative example of such adaptation, the transistors which must be arranged in two opposite end regions of such a memory cell, and not at its center, are the NMOS transistors of the inverters.

The invention claimed is:

1. A SRAM memory cell comprising two inverters and a plurality of switches, the SRAM cell being manufactured in a technology offering N/P shunt capabilities, the inputs of the inverters being connected to at least one pair of bit lines (BLa, BLa/; BLb, BLb/) via two of said switches, said switches being controlled by a signal word line (WLa, WLb), each inverter comprising a first transistor (MN0, MN1) of a first conductivity type and a second transistor (MP0, MP1) of a second conductivity type, and each switch comprising at least a third transistor (MN4, MN5) of the first conductivity type, characterized in that the two transistors (MP0, MP1) of the second conductivity type in the inverters are arranged in two opposite end regions of the memory cell, respectively.

2. A SRAM memory cell according to claim 1, characterized in that a conductivity type is set with a voltage threshold adjustment implant (20, 21) and wherein the implants of the two transistors (MP0, MP1) of the second conductivity type in the inverter are spatially separated.

3. A SRAM memory cell according to any preceding claims, characterized in that its general shape comprises corners, and in that the two transistors (MP0, MP1) of the second conductivity type of the inverter are arranged in two opposite corners.

4. A SRAM memory cell according to the preceding claim, characterized in that the cell shape is generally rectangular and two transistors (MP0, MP1) of the second conductivity type of the inverter are arranged diagonally.

5. A SRAM memory cell according to any one of the preceding claims, characterized in that the transistors of each inverter and the switch transistor(s) connected to the input of said each inverter in question are built with a unique active area (22, 23).

6. A SRAM memory cell according to any one of the preceding claims, characterized in that the gates (30, 31, 30', 31') of all the transistors in the cell are aligned along a given direction.

7. A SRAM memory cell according to the preceding claim, characterized in each second transistor of the second conductivity type of the inverters is arranged so that, along said direction, they have in their vicinity only one adjacent transistor of the first conductivity type.

8. A SRAM memory cell according to the preceding claim, characterized in said adjacent transistor of the first conductivity type constitutes the first transistor of one of the inverters.

9. A SRAM memory cell according to any one of the preceding claims, characterized in that it comprises two pairs of contacts (35-36, 35'-36') arranged so that, in cooperation with two respective first levels of conductive tracks, the inputs of the inverters are respectively electrically connected to a port of the switch(es) which is(are) connected to said input in question.

10. A SRAM memory cell according to any preceding claims, characterized in that it is made in a SOI substrate.

11. A SRAM memory cell according to any one of the preceding claims, characterized in that the inputs of the inverters are connected to a first pair of bit lines (BLa, BLa/) via a first pair of switches being controlled by a first word line (WLa), and to a second pair of bit lines (BLb, BLb/) via a second pair of switches being controlled by a second word line (WLb), each switch of said first pair of switches comprising said third transistor (MN4, MN5) and each switch of said second pair of switches comprising a fourth transistor (MN2, MN3) of the first conductivity type.

12. A SRAM memory comprising a plurality of SRAM memory cells according to any of the preceding claims.

* * * * *